US008521473B2

(12) United States Patent
Castro et al.

(10) Patent No.: US 8,521,473 B2
(45) Date of Patent: Aug. 27, 2013

(54) METHOD OF ADAPTIVE DATA ACQUISITION

(75) Inventors: Rui Manuel Castro, Eindhoven (NL); Jarvis David Haupt, Apple Valley, MN (US); Robert David Nowak, Madison, WI (US)

(73) Assignee: The Trustees of Columbia University in the City of New York, NY, NY (US)

( * ) Notice: Subject to any disclaimer, the term of this patent is extended or adjusted under 35 U.S.C. 154(b) by 343 days.

(21) Appl. No.: 12/814,164

(22) Filed: Jun. 11, 2010

(65) Prior Publication Data

US 2011/0119031 A1 May 19, 2011

Related U.S. Application Data

(60) Provisional application No. 61/186,216, filed on Jun. 11, 2009, provisional application No. 61/251,582, filed on Oct. 14, 2009.

(51) Int. Cl.
*G06F 17/18* (2006.01)

(52) U.S. Cl.
USPC ............................ 702/181; 702/104; 702/182

(58) Field of Classification Search
USPC ............. 706/14; 702/104, 181–182; 700/28, 700/FOR. 102; 341/51
See application file for complete search history.

(56) References Cited

U.S. PATENT DOCUMENTS

| 5,400,246 | A | * | 3/1995 | Wilson et al. | .................. | 700/17 |
| 6,601,107 | B1 | * | 7/2003 | Seibert | ......................... | 709/240 |
| 7,388,534 | B2 | * | 6/2008 | Astley et al. | .................. | 341/155 |

OTHER PUBLICATIONS

Benaiamini, et al., "Controlling the False Discovery Rate: A Practical and Powerful Approach to Multiple Testing", *J.R. Statist. Soc. B*, 57(1):289-300 (1995).
Chernoff, "A Measure of Asymptotic Efficiency for Tests fo a Hypothesis Based on the Sum of Observations", *Annals of Mathematical Statistics*, 23(4):493-507 (1952).
Haupt, et al., "Adaptive Discovery of Sparse Signals in Noise", *42nd Asilomar Conference on Signal, Systems and Computers*, Pacific Grove, California, 5 pages (2008).
Haupt, et al., "Distilled Sensing: Selective Sampling for sparse Signal Recovery", *Proc. 12th Conference on Artificial Intelligence and Statistics*, Clearwater Beach, Florida, 8 pages (2009).

* cited by examiner

*Primary Examiner* — Elias Desta
(74) *Attorney, Agent, or Firm* — Baker Botts, L.L.P.

(57) ABSTRACT

Methods for adaptive data acquisition are disclosed herein. In one aspect, methods for adaptive data acquisition include performing a first sensing method on a signal having a plurality of components to determine the likelihood that a component is not a relevant signal component, retaining a portion of the signal components sensed using the first sensing method that are above a first threshold, performing a second sensing method on the signal components retained above a first threshold to determine the likelihood that a component is not a relevant signal component, wherein the second sensing method is more reliable than the first sensing method at determining the likelihood that a component is not a relevant signal component, and retaining a portion of the signal components sensed using the second sensing method that are above a second threshold.

19 Claims, 7 Drawing Sheets

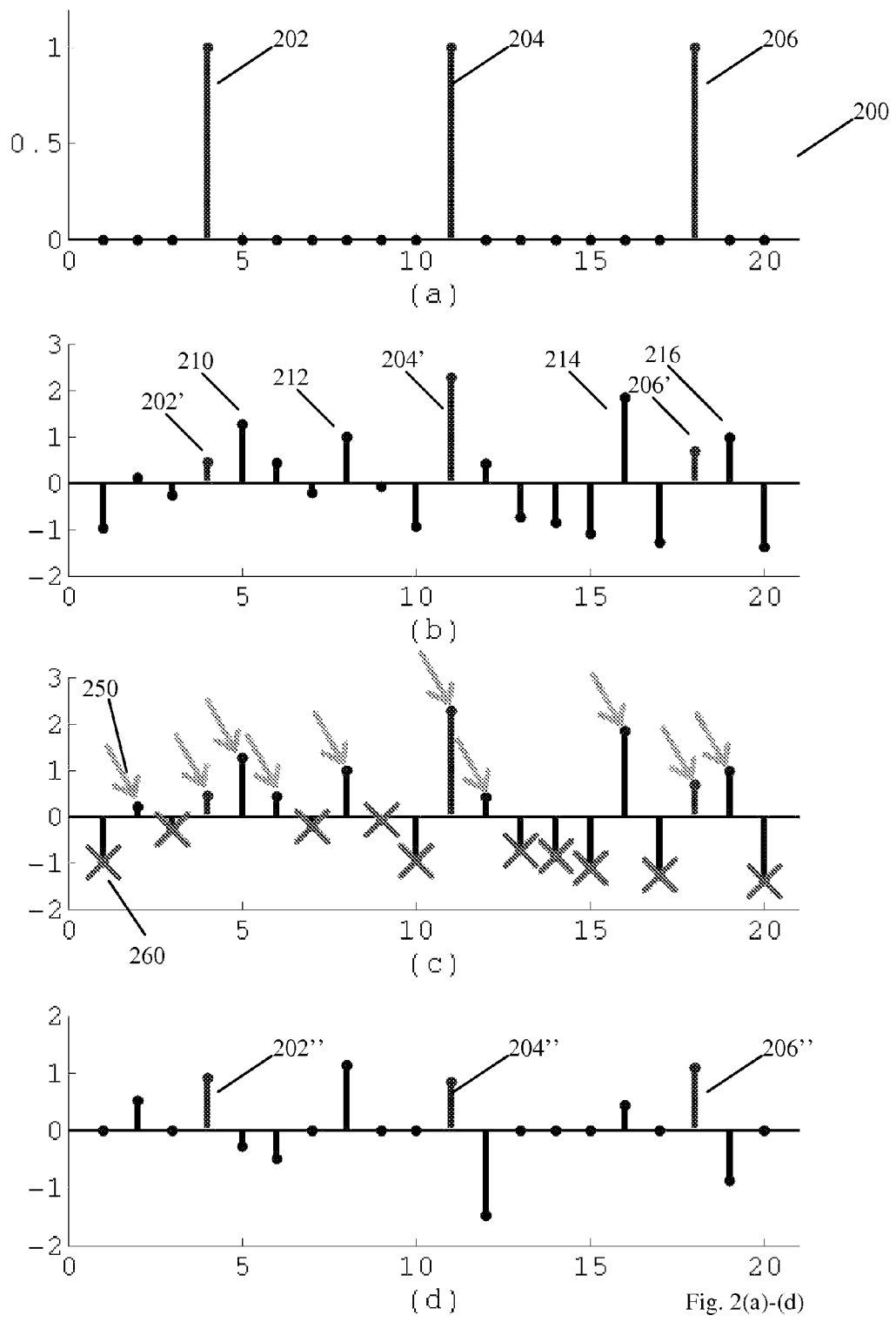
Fig. 2(a)-(d)

330

340

METHOD OF ADAPTIVE DATA ACQUISITION

CROSS-REFERENCE TO RELATED APPLICATIONS

The present application claims priority to U.S. Provisional Application No. 61/186,216, filed on Jun. 11, 2009, and U.S. Provisional Application No. 61/251,582, filed on Oct. 14, 2009, the disclosure of which is are explicitly incorporated in their entirety by reference herein.

STATEMENT REGARDING FEDERALLY-SPONSORED RESEARCH

The disclosed subject matter described herein was made with government support under National Science Foundation Grant No. CCF-0353079 and Air Force Office of Scientific Research Grant No. FA9550-09-1-0140. The government has certain rights in the disclosed subject matter.

BACKGROUND

The present application relates to systems and methods for signal acquisition and recovery, and more particularly to techniques for adaptive data acquisition.

For many weak signals, noise can overwhelm the important information. There are various procedures for extracting a signal (image, spatial or temporal waveform, etc.) from noise.

Consider the following canonical signal model, $$X_i \sim N(\mu_i, 1), i=1, \ldots, n, \qquad (1)$$

where $N(\mu_i, 1)$ denotes the normal distribution with mean $\mu_i$ and unit variance. The signal $\mu=(\mu_1, \ldots, \mu_n)$ is sparse if most of the components $\mu_i$ are zero. Identifying the locations of the non-zero components based on the data $X=(X_1, \ldots, X_n)$ when n is very large is a fundamental problem arising in many applications. A common approach in these problems entails coordinate-wise thresholding of the observed data X at a given level, identifying the locations whose corresponding observation exceeds the threshold as signal components.

Among such methods, false-discovery rate (FDR) analysis, described e.g., in Benjamini et al. (1995), *Controlling the false discovery rate: a practical and powerful approach to multiple testing*, J. R. Statist. Soc. B, 57, 289-300, has been used because it is less conservative than Bonferroni correction, and because it enjoys asymptotically optimal performance characteristics. Suppose that the number of non-zero components of $\mu$ grows sublinearly in n according to $n^{1-\beta}$ for $\beta \in (0, 1)$, and that each non-zero component takes the same (positive) value $\sqrt{2r \log n}$ for $r > 0$. For a given recovery procedure, the false-discovery proportion (FDP) can be defined to be the number of falsely discovered components relative to the total number of discoveries, and the non-discovery proportion (NDP) to be the number of non-zero components missed relative to the total number of non-zero components. The asymptotic limits of sparse recovery for data collected according to equation (1) are sharply delineated in the $(\beta, r)$ parameter space. Specifically, if $r < \beta$, no recovery procedure based on coordinate-wise thresholding of the observed data can drive the FDP and NDP to zero as $n \to \infty$. But, when $r > \beta$, there exists a recovery procedure based on coordinate-wise thresholding that drives both the NDP and FDP to zero as $n \to \infty$. Thus, the relation $r = \beta$ defines a sharp asymptotic boundary in the parameter space, identifying when sparse signals observed under equation (1) can be reliably recovered.

Suppose that a n×1 signal $\mu$ in noise is observed according to equation (1). The signal $\mu$ is assumed to be sparse—that is, most of the components of the signal are equal to zero. S can be defined as $S=\{i: \mu_i \neq 0, i=1, \ldots, n\}$. The elements of S are called the signal components, and the elements in the complement set, $S^c = \{1, \ldots, n\} \setminus S$, are called null components. The goal of a signal recovery procedure is to identify the signal components (in other words, estimate S) using the observed data X. Let $\hat{S}(X)$ be the outcome of a given signal recovery procedure. The false-discovery proportion (FDP) can then be defined to be the ratio between the number of falsely-discovered signal components and the total number of discovered components, $FDP = |\hat{S}(X) \setminus S| / |\hat{S}(X)|$, and the non-discovery proportion defined to be the ratio between the number of undiscovered signal components and the total number of signal components, $NDP = |S \setminus \hat{S}(X)| / |S|$. An effective signal recovery procedure controls both the FDP and NDP.

Consider sparse signals having $n^{1-\beta}$ signal components each of amplitude $\sqrt{2r \log n}$, for some $\beta \in (0, 1)$ and $r > 0$, under equation (1). A coordinate-wise thresholding procedure.

$$S(X) = \{i: X_i > \tau\}, \tau > 0, \qquad (2)$$

can be used to estimate the locations of the signal components. It follows that if $r > \beta$, equation (2), with a threshold $\tau$ that may depend on r, $\beta$, and n, drives both the FDP and NDP to zero with probability one as $n \to \infty$. Conversely, if $r < \beta$, then no such coordinate-wise thresholding procedure can drive the FDP and NDP to zero simultaneously with probability tending to one as $n \to \infty$. In other words, for the specified signal parameterization and observation model, the $(\beta, r)$ parameter plane is partitioned into two disjoint regions. In the region $r > \beta$, sparse signal components can be reliably located using a coordinate-wise thresholding procedure. In the complementary region where $r < \beta$, no coordinate-wise thresholding procedure is reliable in the sense of controlling both the FDP and NDP. This establishes a sharp boundary in the parameter space, $r = \beta$, for large-sample consistent recovery of sparse signals.

In adaptive measurement procedures, the location or method of future measurements or experiments depends (in a strict statistical sense) on the outcomes of prior and present measurements. In contrast, procedures where the measurement process or set of experiments can be specified completely before any data are collected (procedures that do not utilize feedback to guide future measurements or experiments) are called non-adaptive procedures. Adaptive measurement can succeed at recovering signals that are otherwise unrecoverable using passive methods because the signals are either too weakly expressed or have too few relevant signal components.

SUMMARY

Improved techniques for adaptive data acquisition are disclosed herein.

In one aspect, a method for adaptive data acquisition includes performing a first sensing method on a signal having a plurality of components to determine a first probability that a component is not a relevant signal component, comparing the determined first probability for each of the plurality of components with a first threshold to determine a first subset of components that meet the threshold, performing a second sensing method on the first subset of components to determine a second probability that a component is not a relevant signal component, where the second probability is more reliable than the first a probability, and comparing the determined second probability for each of the first subset of components with a second threshold to determine a second subset of components that meet the second threshold.

In some embodiments, a third sensing method is performed on the second subset of components to determine a third probability that a component is not a relevant signal component. The third probability is more reliable than the second probability.

In some embodiments, the second sensing method is selected from the group consisting of an average of repeated samples of the first sensing method and an increased observation time of the first sensing method.

In some embodiments, the third sensing method is selected from the group consisting of an average of repeated samples of the first or second sensing method and an increased observation time of the first or second sensing method.

In some embodiments, the first subset of components that meet the first threshold comprises about 25 percent to about 75 percent of the plurality of components of the signal.

In some embodiments, the second subset of components that meet the second threshold comprises about 25 percent to about 75 percent of the first subset of components.

In some embodiments, the third subset of components that meet the third threshold comprises about 25 percent to about 75 percent of the second subset of components.

In some embodiments, the third subset of components comprises a majority of the relevant signal components.

In another aspect, methods for adaptive data acquisition include performing a first sensing method on a signal having a plurality of components to determine a first probability that a component is not a relevant signal component, comparing the first probability for each of the plurality of components with a first threshold to determine a subset of components that meet the first threshold, performing a further sensing method on the determined subset of components to determine a further probability that a component is not a relevant signal component, where the further probability is more reliable than a probability determined by a previously-used sensing method, comparing the further probability for each of the subset of components with a further threshold to determine a subset of components that meet the further threshold, and if a predetermined number of sensing iterations have been performed or if a predetermined sensing budget is exhausted, identifying a final subset components, or else repeating the process of performing a further sensing method on the determined subset of components to determine a further probability that a component is not a relevant signal component and comparing the determined further probability for each of the subset of components with a further threshold until the predetermined number of sensing procedures have been performed or the predetermined sensing budget is exhausted, then identifying a final subset of components.

BRIEF DESCRIPTION OF THE DRAWINGS

FIG. 2 shows the effect of the procedure of FIG. 1 on a first sample signal;

DETAILED DESCRIPTION

Figure 1:
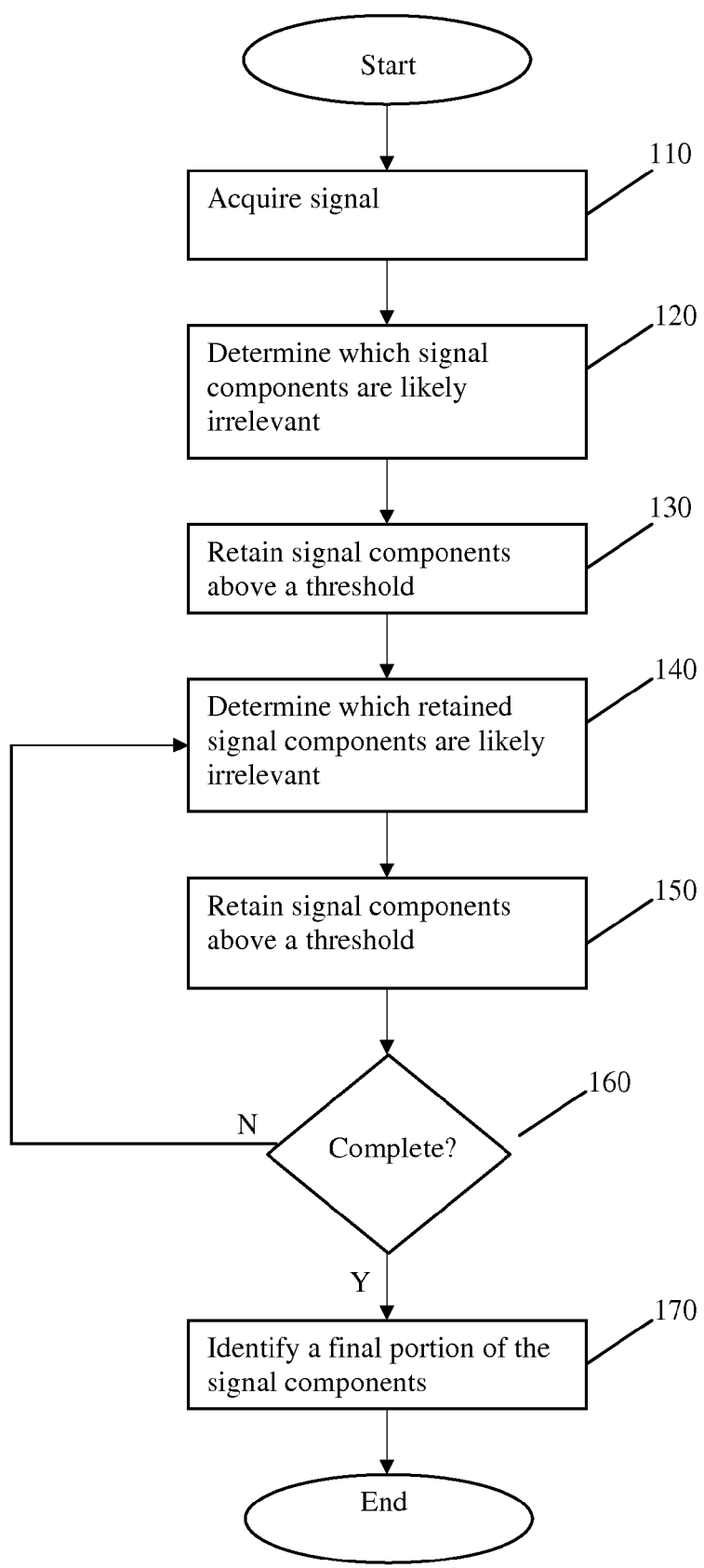
FIG. 1 shows an exemplary procedure according to one aspect of the disclosed subject matter.

The disclosed subject matter pertains to Distilled Sensing (DS), including a multi-part data acquisition (sampling) procedure that is suitable for a wide variety of applications for which the task of interest includes detection, estimation, and/or general recovery of a signal, abstractly described as a vector, from a collection of uncertain or "noisy" measurements. In part, DS is based on the notion that sometimes it can be easier to rule out locations that do not contain signal than it is to directly identify non-zero signal components.

The disclosed subject matter provides a procedure for allocating resources using a feedback process. An exemplary method is provided for determining how and where measurements are acquired, based on the outcomes of previous measurements, in a way that systematically improves the effectiveness of each subsequent measurement. Improvements can be shown in a number of metrics, including increased signal-to-noise ratio, reduced acquisition time, reduced power or energy expenditure, reduced utilization of acquisition resources, and improved reliability for signal detection, or increased fidelity for signal estimation.

As compared to traditional techniques, the disclosed subject matter realizes significant improvements in settings where the signals of interest are sparse or nearly sparse—that is, in settings where the signal can be accurately described or represented using a relatively small number of significant coefficients. Signals of interest may be sparse in the "canonical" representation (a model that is well-suited to microarray analysis applications and astronomical imaging), or the sparsity may be present in other bases or representations. For example, in spectral estimation applications the signals of interest may be sparse in a Fourier (frequency) representation, while natural images often exhibit sparsity in wavelet representations.

Distilled sensing can predict where the signal exists and narrow the field of subsequent measurements. This can become significant when speed and energy expenditure are key criteria over which the recovery procedure is to be optimized.

Applications for distilled sensing include imaging applications (including conventional imaging, astronomical and cosmic imaging, and medical imaging such as MRI), biomedical applications (including gene expression microarray experiments), communications (including channel sensing tasks inherent to cognitive radio applications and general spectrum estimation), signal intelligence, and others.

For cognitive radio speed is significant since it uses unused portions of the electro-magnetic spectrum (spectral holes) to send signals. This requires that the radio can find the spectral holes and transmit a signal before that portion of the spectrum interferes with a signal from another device. Distilled sensing can function within the spectrum sensing function of the cognitive radio providing more accurate localization of spectral holes, in a reduced amount of time.

FIG. 1 illustrates a procedure according to one aspect of the disclosed subject matter. A signal is acquired (110). The signal is observed to determine which signal components are likely to be irrelevant signal components (120). For example, irrelevant signal components may be those that correspond to noise observed in the signal rather than true data points. Signal components that are more likely to be relevant signal components, above a certain threshold, are retained (130). Such retained signal components can include for example, the non-negative values. Or, for example in the case where a spectral hole is being sought, retained signal components can include the locations where the smallest signal values are obtained. The threshold above which signal components are retained may be half of the most likely relevant signal components. Optionally, other fixed portions of the signal (i.e., other than half) may be retained. For example, 1/10 up to 9/10 of the signal may be retained.

The retained signal components are then observed to determine which of the retained signal components are more likely to be irrelevant signal components (140). The observation performed at 140 is more reliable at determining whether signal components are likely to be irrelevant than the observation performed at 120. For example, the observation at 140 may use an average of repeated samples of the observation performed at 120, or an increased observation time of the observation performed at 120, or a different method of observation. Signal components that are more likely to be relevant signal components, above a certain threshold, are retained (150). As in 130, such retained signal components can include for example, the non-negative values or locations where the smallest signal values are obtained. The threshold above which signal components are retained may be half of the most likely relevant signal components or another fixed portion of the retained signal components.

This process can then be repeated (160), so that additional signal components that are more likely to be irrelevant signal components are determined, and a fixed portion of the more likely relevant signal components are retained. The process can be repeated, for example, for a predetermined number of observations or until a predetermined sensing budget is exhausted. The predetermined number of observations may be related to the total number of signal components. For example, the predetermined number of observations can be less than or equal to log log n, where n is the total number of signal components. A final portion of the signal components can then be identified (170).

FIG. 2 demonstrates the effect of the procedure of FIG. 1 on a signal. A signal 200 is acquired and has three nonzero components 202, 204, 206, as shown in FIG. 2(a). FIG. 2(b) shows a collection of observations of the signal including Gaussian noise with unit variance. It can be challenging, from the noisy data, to identify a small subset of locations that correspond to relevant signal components. Only one (204') of the 5 largest noisy observations 210, 212, 204', 214, 216 actually corresponds to a relevant signal component. Since the signal only consists of positive components, thresholding at zero, as shown in FIG. 2(c), identifies locations that are irrelevant. Locations identified by arrows 250 may contain relevant signal components, while those identified by X's 260 likely do not. Subsequent samples can be focused onto the subset of locations deemed most likely to contain relevant signal components. In addition, instead of taking one new sample per entry, for the same sample budget two samples can be collected at each of the more probable locations, and then averaged to reduce the noise. The result of this observation procedure is depicted in FIG. 2(d). Thresholding at zero can be performed again and the process can be repeated.

The disclosed subject matter includes taking multiple observations, optionally adjusting the focus in a sequential fashion, instead of simply taking a single observation of a sparse signal in noise. The disclosed subject matter provides techniques based on an approach that after the first observation, one can rule out a large number of components where the signal is probably not relevant, and then focus sensing resources into the remaining locations in question. Formalizing this idea, for the same budget of sensing resources, sequential adaptive sensing procedures dramatically outperform non-adaptive procedures, resulting in different scaling laws in terms of estimability. Rather than requiring that the non-zero components obey $\mu_i > \sqrt{2\beta \log n}$, a novel adaptive sensing procedure called distilled sensing (DS) provides that sparse signals at level $\mu_i = \alpha(n)$, where $\alpha(n)$ is any positive monotone diverging sequence in n that exceeds the m-fold iterated logarithm function, $$\log^{[m]} n = \underbrace{\log \log \ldots \log n}_{\text{repeated } m \text{ times}}.$$

for an arbitrary finite integer m, can be recovered in the sense that there exists a coordinate-wise thresholding procedure that sends the FDP and NDP to zero as $n \to \infty$. In other words, DS can detect dramatically weaker signals than non-adaptive methods.

Equation (1) can be generalized to allow multiple observations, indexed by j, of the form $$X_i^{(j)} = \sqrt{\phi_i^{(j)}} \mu_i + Z_i^{(j)}, \quad (3)$$

for i=1, 2, ..., n and j=1, 2, ..., k, where each $\phi_i^{(j)}$ is non-negative, and $Z_i^{(j)} \text{iid} \sim N(0,1)$ In addition, the restriction $\Sigma_{ij} \phi_i^{(j)} \leq n$ can be imposed limiting the total amount of sensing energy. Note that the standard observation model (1) takes the form (3) with k=1 and $\phi_i^{(1)} = 1$ for i=1, ..., n. Another possibility is to make multiple iid observations, but each with only a fraction of the total sensing energy budget. For example, set $\phi_i^{(j)} = 1/\sqrt{k}$, i=1, ..., n, for j=1, ..., k. Because of the independence of the $Z_i^{(j)}$, $\Sigma_{j=1}^k X^{(j)}$ is equivalent to X in the standard model in this case as well. There are other non-adaptive choices of $\{\phi_i^{(j)}\}_{ij}$ that yield the same result. Furthermore, the applicants are not aware of any non-adaptive sensing scheme exists that can produce better results than those obtained using observations from the standard model (1).

The disclosed subject matter involves an adaptive, sequential designs of $\{\phi_i^{(j)}\}_{ij}$ that tends to focus on the signal components of μ. In other words, $\phi_i^{(j)}$ is allowed to depend explicitly on the past $\{\phi_i^{(l)}, X_i^{(l)}\}_{i,l<j}$. The principle upon which the procedure is based is the following—given a collection of noisy observations of the components of a sparse vector, it is typically easier to identify a large set of null components (where the signal is absent) than it is to identify a small set of signal components. When multiple observations of each component are allowed, this permits to a process for refining observations—iteratively allocate more sensing resources to locations that are most promising while ignoring locations that are unlikely to contain signal components. This is reminiscent of the purification that occurs in the process of distillation and hence is referred to as distilled sensing (DS).

Algorithm 1 depicts a procedure according to one aspect of the disclosed subject matter.

---

Algorithm 1: Distilled Sensing.

Input:
   Number of observation steps k;
   Energy allocation strategy: $\epsilon^{(j)}, \Sigma_{j=1}^k \epsilon^{(j)} \leq n$;
Initialize:
   Initial index set $I^{(1)} \leftarrow \{1, 2, \ldots, n\}$;
Distillation:

-continued

Algorithm 1: Distilled Sensing.

for j = 1 to k do $$X_i^{(j)} = \begin{cases} \sqrt{\frac{\varepsilon^{(j)}}{|I^{(j)}|}} \mu_2 + Z_i^{(j)}, & i \in I^{(j)} \\ Z_i^{(j)}, & i \in I^{(1)} \setminus I^{(j)} \end{cases};$$

$$I^{(j+1)} \leftarrow \{i \in I^{(j)} : X_i^{(j)} > 0\};$$

end
Output:
Final index set $I^{(k)}$;
Distilled observations $X_{DS}^{(k)} := \{X_i^{(k)} : i \in I^{(k)}\}$;

Let k denote the number of observations in the DS process, and divide the total budget of sensing energy among the observations. Each observation takes the form (3), where the sensing energy allocated to that observation is distributed equally among the set of locations of interest at that individual observation. Following each of the first k−1 observations, a refinement or distillation is performed, identifying the subset of locations where the corresponding observation is positive. The rationale is that it is highly improbable that the signal (which is assumed to be positive) is present at locations where the observation is negative. The algorithm terminates after the final observation, and the output consists of the final observations and the set of locations that were measured in the last observation.

To quantify the performance of DS, it can be shown that each distillation retains most of the locations corresponding to signal components, but only about half of the locations corresponding to null components. When the signal μ is sparse, this implies that the effective dimension is roughly halved at each observation. A judicious allocation of sensing energy over observations provides increasing sensing energy per location in each subsequent observation, resulting in a net exponential boost in the effective amplitude of each measured signal component. As a result, applying a coordinate-wise thresholding procedure to the output observations of DS results in significant improvements in recovery compared to procedures that utilize non-adaptive sensing.

An energy allocation scheme is now disclosed that is designed to balance the probabilities of successful retention of signal components at each part in the process, by allocating a larger portion of the sensing energy to the initial portion and decreasing the energy used later when there are fewer locations to observe. The exponential decrease in the number of observed locations at each observation suggests that the sensing energy allocated to each can also decrease exponentially. To accomplish this, energy for the first k−1 observations is allocated according to the entries of a geometric progression, and put the remaining energy on the last observation. For a fixed parameter 0<Δ<1, the energy allocation scheme is $$E^{(j)} = \begin{cases} \frac{\Delta n}{2}\left(1 - \frac{\Delta}{2}\right)^{j-1}; & j = 1; \ldots ; k-1 \\ n\left(1 - \frac{\Delta}{2}\right)^{k-1}; & j = k \end{cases}, \quad (4)$$

and the total energy expended satisfies $\sum_{j=1}^{k} E^{(j)} = n$.

The first main result quantifies the performance gain provided by distilled sensing (DS) when the number of observations is fixed. The result, stated below, establishes an expanded region of large-sample consistent recovery in the (β, r) parameter space.

Let k be a positive integer, and consider applying the k-part DS procedure using the sensing energy allocation strategy described in (4) with fixed parameter 0<Δ<1, to sparse signals $\mu \in \mathbb{R}^n$ having $n^{1-\beta}$ signal components each of amplitude $\sqrt{2r\log n}$, for some $\beta \in (0, 1)$ and r>0. If $r > \beta/(2-\Delta)^{k-1}$, there exists a coordinate-wise thresholding procedure of $X_{DS}^{(k)}$ of the form (2) that drives both the FDP and NDP to zero with probability tending to one as n→∞.

In other words, this result shows that a small number of observations can lead to a significant improvement in terms of recoverability—the minimum signal amplitude required for consistent recovery decreases exponentially as a function of the number of observations in the DS procedure. A natural question arises as to whether the number of observations can be large enough, so that signals whose amplitudes grow (with the dimension n) slower than $\sqrt{\log n}$ can be recovered. This question is addressed by letting the number of observations tend to infinity slowly as a function of n.

Using the sensing energy allocation strategy described in (4) with fixed parameter 0<Δ<1, let $$k = 1 + \left\lceil \frac{\log\log n}{\log(2 - \Delta)} \right\rceil, \quad (5)$$

and apply the k-part DS procedure to sparse signals $\mu \in \mathbb{R}^n$ having $n^{1-\beta}$ signal components each of amplitude α=α(n). If α(n) is any positive monotone diverging sequence in n that exceeds the m-fold iterated logarithm $\log^{[m]} n$ for some finite integer m, then there exists a coordinate-wise thresholding procedure of $X_{DS}^{(k)}$ of the form (2) that drives both the FDP and NDP to zero with probability tending to one as n→∞.

In other words, DS can result in dramatic improvements in recoverability, as it succeeds at recovering signals whose amplitudes are vanishingly small relative to those of signals that can be recovered using the best non-adaptive methods.

Simulation

The analysis establishes that DS is considerably more powerful than conventional non-adaptive sensing in the large-sample regime. Thus, the finite-sample performance of DS with a simulation experiment is provided. For recovery, equation (2) can be applied, using the data-dependent threshold identified by the Benjamini and Hochberg procedure at a specified FDR level, where FDR is defined as the expected value of the FDP. This recovery is called BH thresholding.

FIG. 3 shows a validation of a DS procedure according to one aspect of the disclosed subject matter.

Figure 3A:
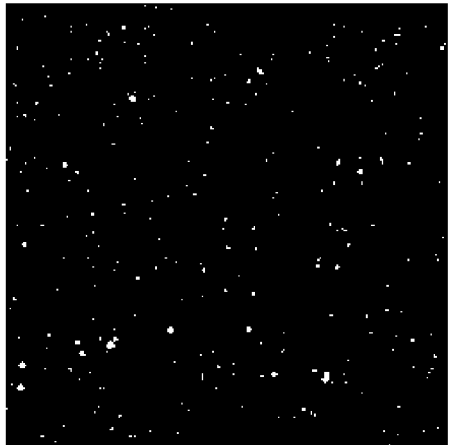
FIG. 3 shows the effect of the procedure of FIG. 1 on a second sample signal.
Figure 3B:
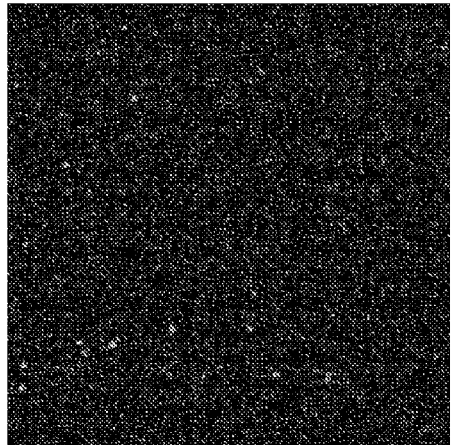
Figure 3C:
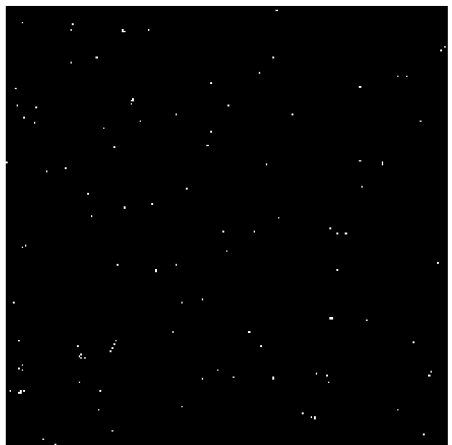
Figure 3D:
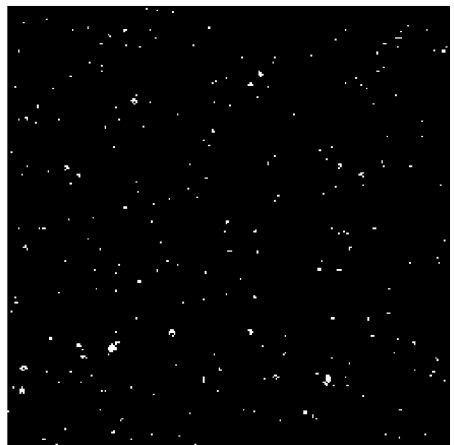

FIG. 3(a) depicts a portion of a real radio telescope image 310 collected by the Phoenix Deep Sky Survey (www.physics.usyd.edu.au/~ahopkins/phoenix/). The image size is 256×256 pixels and 533 pixels have nonzero amplitudes of 2:98 (implying β=0.43 and r=0.4). FIG. 3(b) depicts a simulated noisy version 320 of the image, equivalent to a collection of non-adaptive observations from the model (1), where to improve visualization, locations whose corresponding observations were negative are mapped to black (amplitudes of positive observations are unaltered). FIG. 3(c) shows the result 330 of applying BH thresholding at FDR level 0.05 to the non-adaptive observations, and FIG. 3(d) shows the output 340 of DS with Δ=0.9 and k=5 after BH thresholding at the same level (Δ was chosen to be conservative—in practice, larger values of Δ allocate more sensing energy to earlier observations, resulting in fewer total non-discoveries). Note that considerably more "stars" are recovered by DS.

Figure 3E:
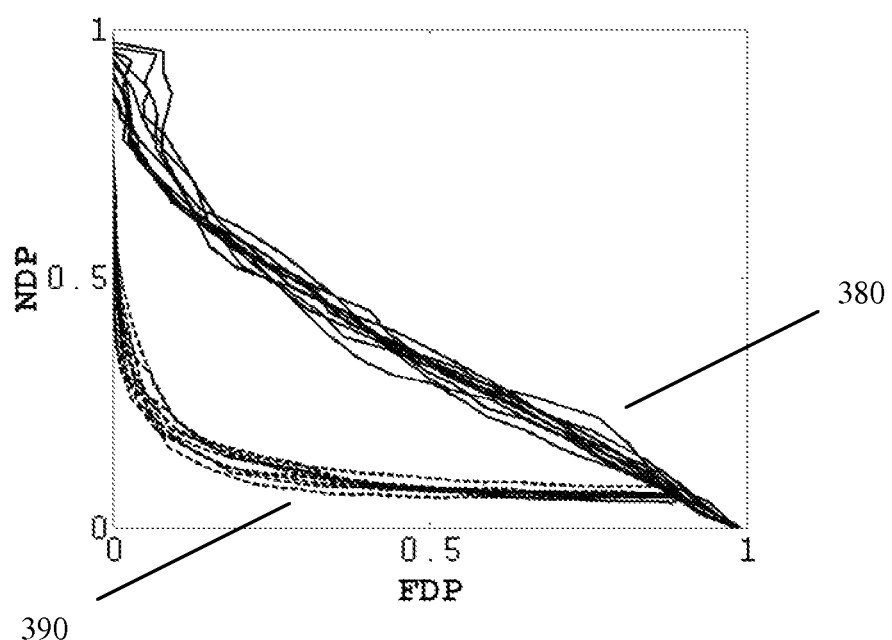

FIG. 3(e) is a graph showing the benefit of DS in terms of false and non-discovery proportions for ten trials of each procedure applied to the noisy star recovery whose one-trial results are depicted graphically in FIGS. 3(a)-(d). Curves for non-adaptive sampling followed by BH thresholding are solid lines 380, while curves for DS ($\Delta$=0.9, k=5) followed by BH thresholding are dashed lines 390. The separation of curve clusters illustrates the improvement of DS per trial and on average. For the same FDP, DS yields lower NDPs than non-adaptive sampling, except sometimes at very high FDP levels, quantifying the improvement that is observed when visually comparing FIGS. 3(c)-(d).

A fundamental difference between non-adaptive sensing and DS can be understood by comparing false and non-discovery criteria. Recovery procedures based on non-adaptive sampling methods control the FDP and NDP simultaneously, while each part of DS only controls the number of non-discoveries (keeping it near zero), and allows the number of false discoveries to remain large (most discoveries are false when the signal is sparse). Simultaneous FDP and NDP control for DS is performed only after the last observation, when sensing resources have been efficiently focused into the signal subspace.

FIG. 4 compares the FDP vs. NDP performance of the DS procedure in one embodiment to non-adaptive (single observation) measurement at several signal-to-noise ratios (SNRs). At each SNR, 1000 random sparse signals were randomly generated and both the non-adaptive observation data and the output of the DS procedure were thresholded at a random positive level. The random threshold level in each trial allows us to explore the full range of FDP and NDP. The FDP and NDP were calculated for both results in each trial.

Figure 4A:
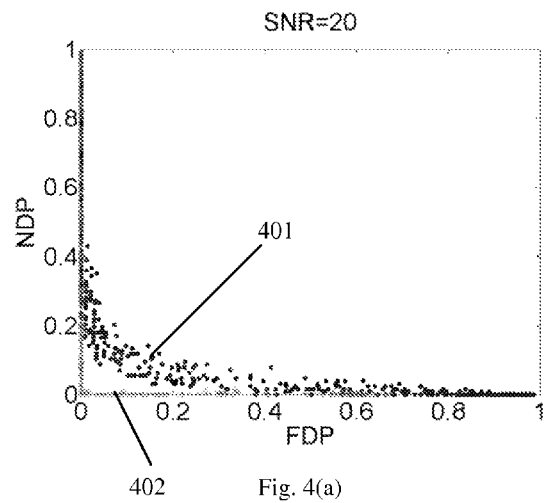
FIG. 4 shows the performance of an embodiment of the disclosed subject matter compared to a non-adaptive method at several signal-to-noise ratios.
Figure 4B:
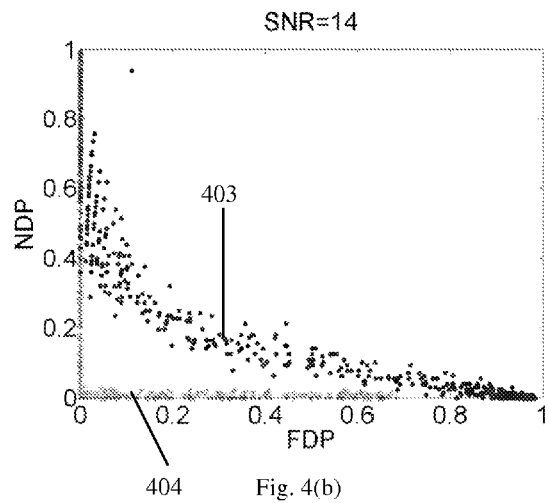
Figure 4C:
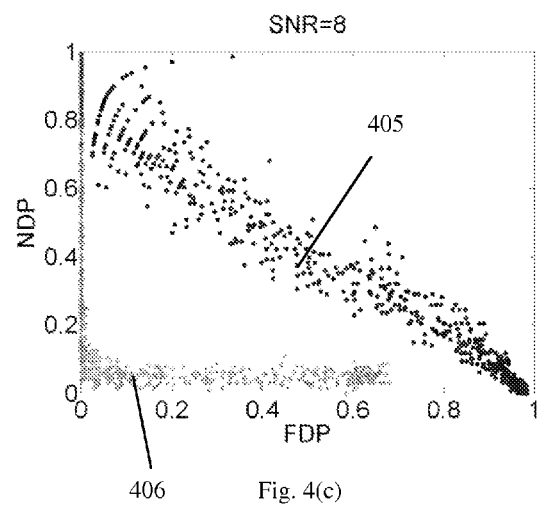
Figure 4D:
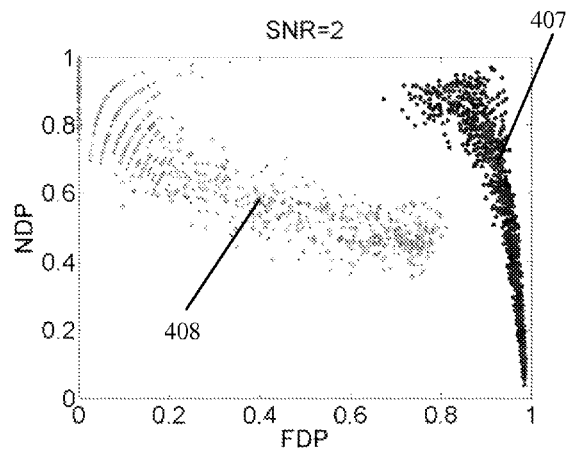

In FIG. 4(a), where the SNR=20, both DS 402 and non-adaptive measurements 401 are highly successful, as expected. FIG. 4(b) shows the FDP vs. NDP performance of the non-adaptive method 403 degrade noticeably at SNR=14 compared to DS 404. At SNR=8 in FIG. 4(c), the simulations show that DS 406 remains highly successful at this level while the non-adaptive results 405 are poor. Finally, when the SNR=2, shown in FIG. 4(d), DS 408 still yields useful results while the non-adaptive method 407 does not. For example, at FDP=0.05, the DS procedure has an average NDP of roughly 80% (i.e., 20% of the true components are still detected, on average). This demonstrates the approximate log p extension of the SNR range provided by DS.

Note the gap in the FDP values of the DS results (roughly from 0.75 to 1). The gap arises because the output of DS has a higher SNR and is much less sparse than the original signal, and so arbitrarily large FDP values cannot be achieved by any choice of threshold. Large FDP values are, of course, of little interest in practice. Structured patterns are observed in cases of high NDP and low FDP (in upper left of FIGS. 4(c) and 4(d)). The visually structured 'curves' of NDP-FDP pairs arise when the total number of discoveries is small, and hence the FDP values are restricted to certain rational numbers. For example, if just 3 components are discovered, then the number of false-discoveries can only take the values 0, 1/3, 2/3, and 1.

Figure 5:
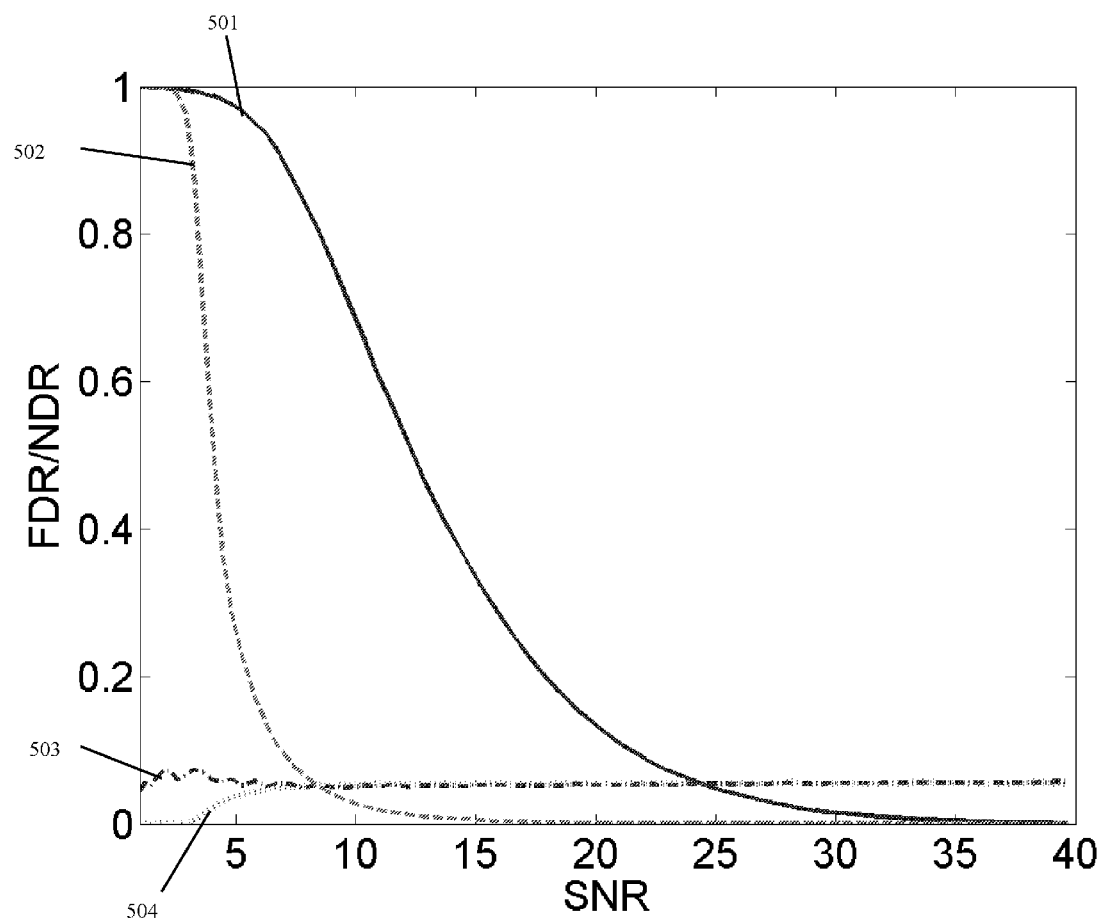
FIG. 5 shows the average performance of an embodiment of the disclosed subject matter compared to a non-adaptive method.

FIG. 5 compares the average performance of the DS procedure in one embodiment to non-adaptive sensing in terms of the false-discovery rate (FDR) and the non-discovery rate (NDR), which are the average false-discovery and non-discovery proportions, respectively. The non-discovery rate is the average NDP over 1000 independent trials at each SNR and with threshold set to achieve FDR=0.05 (FDR is the average FDP). Curve 501 depicts the NDR of non-adaptive sensing and curve 502 depicts the NDR of the DS procedure. At the bottom of the figure, curves 503 and 504 show the FDR for non-adaptive sensing and DS, respectively (at approximately 5% for both). FIG. 5 shows that the DS procedure achieves a much lower NDR over the entire SNR range.

An alternate way to evaluate DS is to compare the minimal sensing energy budget required to achieve the same large-sample performance as non-adaptive sensing methods (recoverability only when r>$\beta$). The results obtained here imply that procedures based on DS will be able to recover the same signals as non-adaptive sensing methods using an energy budget that grows only sublinearly with n, implying that DS can recover signals using less sensing energy (or in less time) than what is required by non-adaptive sensing methods.

While the results presented here are asymptotic in nature, the performance of DS can also be quantified in finite-dimensional settings using the intermediate result hereafter. Rather than exhibiting sharp asymptotics, the efficacy of DS in finite-dimensional problems is quantified by probabilities of success that vary depending on r, $\beta$, $\Delta$ and n. In addition, in finite-dimensional applications, DS can be modified to improve the retention of true signal components, at the expense of rejecting fewer null components, by selecting a less aggressive (slightly negative) threshold at each part of the DS procedure.

Establishing the main results of the disclosure amounts to counting how many locations corresponding to signal and null components are retained by thresholding the observations at level zero in each distillation. First, the signal components are considered.

Consider a vector $\mu$ with s components, each of amplitude $\alpha$>0, observed according to the model $X_i=\sqrt{\phi}\mu_i+Z_i$ where $Z_i$ is a collection of independent N(0,1) noises and $\phi$>0 denotes the amount of sensing energy allocated to each location. When the amplitude satisfies $\alpha \geq 2/\sqrt{\phi}$, the number of components retained by thresholding the observations at the level zero, denoted $\tilde{s}$, satisfies $(1-\epsilon)s \leq \tilde{s} \leq s$ with probability at least $$1 - \exp\left(-\frac{\alpha \cdot s}{4}\sqrt{\frac{\phi}{2\pi}}\right),$$

where $$\epsilon = \frac{1}{\alpha}\sqrt{\frac{1}{2\pi\phi}} \leq \frac{1}{2\sqrt{2\pi}}.$$

The upper bound on $\epsilon$ follows from the condition on $\alpha$, and ensures that the fraction of vector components retained is bounded away from zero.

Next, the number of components retained by thresholding can be counted. For that, a standard bound on tail probabilities of Gaussian random variables can be utilized, which states that if Z~N($\gamma$,1) for $\gamma$>0, then $\Pr(Z<0) \leq (\gamma\sqrt{2\pi})^{-1}\exp(-\gamma^2/2)$.

To each component observation $X^i$, assign a Bernoulli random variable $T_i=1_{\{Xi>0\}}$, which is equal to one whenever the observation exceeds 0, and zero otherwise. Let p=Pr($T_i$=1). The number of vector components whose observations exceed the threshold, $\tilde{s}=\Sigma_i T_i$, is a Binomial random variable, with $$1-p \leq \frac{1}{\alpha}\sqrt{\frac{1}{2\pi\phi}}\exp\left(-\frac{\alpha^2\phi}{2}\right).$$

Next, the probability that $\tilde{s} \geq (1-\epsilon)s$ for an appropriately chosen $\epsilon$ can be quantified To that end, the well known bound on the tail probability of the Binomial distribution described in Chernoff (1952), *A measure of asymptotic efficiency for* tests of a hypothesis based on the sum of observations, Ann. Statist., 23, 493-507, can be used. Namely, for a Binomial (n, p) random variable B, whenever $b < \Sigma[B] = np$, $$Pr(B \leq b) \leq \left(\frac{n-np}{n-b}\right)^{n-b}\left(\frac{np}{b}\right)^{b}.$$

In this context, this result implies $$Pr(\tilde{s} \leq (1-\epsilon)s) \leq \left(\frac{1-p}{\epsilon}\right)^{\epsilon s}\left(\frac{p}{1-\epsilon}\right)^{(1-\epsilon)s}.$$

provided $\epsilon > 1-p$, which is satisfied by the choice $$\epsilon = \frac{1}{\alpha}\sqrt{\frac{1}{2\pi\phi}}.$$

Now, notice that when $\alpha > 2/\sqrt{\phi}$, the condition $$-\frac{\alpha^2 \phi \epsilon s}{2} + (1-\epsilon)s\log\left(\frac{1}{1-\epsilon}\right) \leq -\frac{\alpha s}{4}\sqrt{\frac{\phi}{2\pi}}.$$

obtained by upper-bounding the logarithm of the right-hand side of (5), holds for any $\epsilon \in (0, 1)$. The result follows from exponentiating this last bound.

Next, the null components retained by each thresholding procedure are quantified.

Consider a vector $\mu$ with z components, each of amplitude 0, observed according to the model $X_i = \sqrt{\phi}\mu_i + Z_i$, where $Z_i$ is a collection of independent $N(0, 1)$ noises and $\phi > 0$ denotes the amount of sensing energy allocated to each measured location. For any $\epsilon_0 < \frac{1}{2}$, the number of components retained by thresholding the observations at the level zero, denoted $\tilde{z}$, satisfies $(\frac{1}{2}-\epsilon_0)z \leq \tilde{z} \leq (\frac{1}{2}+\epsilon_0)z$, with probability at least $1-2\exp(-2z\epsilon_0^2)$.

To each observation $X_i$, assign a Bernoulli random variable $T_i = 1_{\{X_i > 0\}}$ $T_i = 1_{\{X_i > 0\}}$ which takes the value one when the corresponding observation exceeds 0 and zero otherwise. Since each observation is of noise only, the number of vector components whose corresponding observation exceeds the threshold, $\tilde{z} = \Sigma_i T_i$, is a Binomial random variable with probability $\frac{1}{2}$. Applying Hoeffding's inequality. $Pr(|\tilde{z}-z/2|>\epsilon_0 z) \leq 2\exp(-2z\epsilon_0^2)$, which holds for any $\epsilon_0 > 0$. Imposing the restriction $\epsilon_0 < \frac{1}{2}$ guarantees that the fraction of components retained is within $(0, 1)$.

Taken together, the results above establish that by thresholding at level zero, nearly all of the signal components and about half of the zero components are retained with high probability. Incorporating the geometric allocation of sensing energy per part specified in equation (4), the following is obtained.

Let $\mu \in R^n$ be a sparse signal having $s > 0$ signal components each of amplitude $\alpha$, where $\alpha > 4/\sqrt{\Delta}$, and $z = n - s > s$ null components. In the DS procedure of Algorithm 1, let $1 < k \leq 1 + \log_2(z/s)$, let $\Delta$ be a fixed parameter satisfying $0 < \Delta < 1 - 2\epsilon_0$ for some $\epsilon_0 < \frac{1}{2}$, and let the energy allocation $\epsilon^{(j)}$ be as described in (4). For $j = 1, \ldots, k-1$, define $$\varepsilon^{(j)} = \frac{1}{\alpha}\sqrt{\frac{1}{2\pi\xi^{(j)}}},$$

where $$\xi^{(j)} = \frac{\Delta}{4}\left(\frac{2-\Delta}{1+2\varepsilon_0}\right)^{j-1}.$$

Then, with probability at least $$1 - (k-1)\exp\left(-\frac{\alpha \cdot s}{8} \cdot \sqrt{\frac{\Delta}{2\pi}} \cdot \prod_{j=1}^{k-2}(1-\varepsilon^{(j)})\right)$$

$$- 2(k-1)\exp\left(-2 \cdot z \cdot \varepsilon_0^2\left(\frac{1}{2}-\varepsilon_0\right)^{k-2}\right).$$

the output of the DS procedure, $X_{DS}^{(k)}$, is equivalent in distribution to a single collection of noisy observations of a vector $\mu_{\mathit{eff}} \in \mathbb{R}^{n_{\mathit{eff}}}$ according to the observation model (1). The number of signal components in $\mu_{\mathit{eff}}$ is denoted by $s_{\mathit{eff}}$ and satisfies $$s\prod_{j=1}^{k-1}(1-\varepsilon^{(j)}) \leq s_{\mathit{eff}} \leq s,$$

the effective signal length $n_{\mathit{eff}}$ satisfies $$s\prod_{j=1}^{k-1}(1-\varepsilon^{(j)}) + z\left(\frac{1}{2}-\varepsilon_0\right)^{k-1} \leq n_{\mathit{eff}} \leq s + z\left(\frac{1}{2}+\varepsilon_0\right)^{k-1}.$$

and the effective observed amplitude $\alpha_{\mathit{eff}}$ satisfies $$\alpha_{\mathit{eff}} \geq \alpha\sqrt{\frac{n(1-\Delta/2)^{k-1}}{s+z(1/2+\varepsilon_0)^{k-1}}}.$$

The union bound to the previous result can be applied to enforce the condition for each of the first $k-1$ distillations. Using superscripts on z and s to index the observations, such that $z^{(1)} = z$ and $s^{(1)} = s$, for $\epsilon_0 < \frac{1}{2}$, the bounds $$z^{(1)}\left(\frac{1}{2}-\varepsilon_0\right)^{j-1} \leq z^{(j+1)} \leq z^{(1)}\left(\frac{1}{2}+\varepsilon_0\right)^{j-1}$$

hold simultaneously for all $j = 1, 2, \ldots, k-1$ with probability exceeding $$1 - 2(k-1)\exp\left(-2z^{(1)}\varepsilon_0^2\left(\frac{1}{2}-\varepsilon_0\right)^{k-2}\right).$$

As a result, with the same probability, the total number of locations in each set $I^{(j)}$ satisfies $$|I^{(j)}| \leq s^{(1)} = z^{(1)}\left(\frac{1}{2} + \epsilon_0\right)^{j-1},$$

for $j=1, 2, \ldots, k$. Using these upper bounds and the energy allocation rule (4), a lower bound the sensing energy per location at each part can be obtained, $\phi_i^{(j)} = \epsilon^{(j)}/|I^{(j)}|$, for $i \in I^{(j)}$—specifically, $$\phi_i^{(j)} \geq \begin{cases} \frac{\Delta n(1-\Delta/2)^{j-1}}{2(\varepsilon^{(1)} + z^{(1)}(1/2+\epsilon_0)^{j-1})}, & j=1,\ldots,k-1 \\ \frac{n(1-\Delta/2)^{k-1}}{\varepsilon^{(1)} + z^{(1)}(1/2+\epsilon_0)^{k-1}}, & j=k \end{cases},$$

for $i \in I^{(j)}$ (and $\phi_i^{(j)} = 0$ for $i \notin I^{(j)}$). Notice that when $k \leq 1 + \log_2(z^{(1)}/S^{(1)})$, for each $i \in I^{(j)}$, $$\phi_i^{(j)} \geq \begin{cases} \frac{\Delta}{4}\left(\frac{2-\Delta}{1+2\epsilon_0}\right)^{j-1}, & j=1,\ldots,k-1 \\ \frac{1}{2}\left(\frac{2-\Delta}{1+2\epsilon_0}\right)^{k-1}, & j=k \end{cases}.$$

Since $\Delta < 1 - 2\epsilon_0$, this shows that the amount of sensing energy allocated to each retained location increases exponentially with the number of observations.

Now, conditioned on the above event, the union bound can be applied again so that with probability at least $$1 - (k-1)\exp\left(-\frac{\alpha \cdot s^{(1)}}{S} \cdot \sqrt{\frac{\Delta}{2\pi}} \cdot \prod_{j=1}^{k-2}(1-\epsilon^{(j)})\right),$$

when $\alpha \geq 4/\sqrt{\Delta}$, the bounds $$(1-\epsilon^{(j)})s^{(j)} \leq s^{(j+1)} \leq s^{(j)}$$

hold simultaneously for all $j=1, 2, \ldots, k-1$.

Applying the union bound to both composite events, with the specified probability, the number of signal and null components present in the kth observation are given by $s^{(k)}$ and $z^{(k)}$, respectively, as defined above. Thus, the final effective signal dimension is $s^{(k)} + z^{(k)}$, and the effective observed amplitude of each signal component is obtained using the lower bound on $\phi_i^{(j)}$, establishing the claim.

Before proving the main results, the (limiting) fraction of signal components retained throughout the DS procedure are quantified.

Let $g=g(n)$ and $k=k(n)$ be positive monotone diverging sequences in n, where $g(n)$ exceeds the m-fold iteration $\log^{[m]} n$ for some finite integer m and $k(n) \leq n$. Define $\epsilon^{(j)}(n) = c^{-j}/g(n)$ for some constant $c > 1$, and assume $\epsilon^{(k)}(n) < 1$. Then $$\lim_{n \to \infty} \prod_{j=1}^{k}(1-\epsilon^{(j)}(n)) = 1.$$

Since $c > 1$, $(1-\epsilon^{(j)}(n)) < (1-\epsilon^{(j+1)}(n))$ and thus the expression of interest satisfies $$(1-\epsilon^{(1)}(n))^k = \left(1 - \frac{1}{g(n)c}\right)^k \leq \prod_{j=1}^{k}(1-\epsilon^{(j)}(n)).$$

If $k(n)/g(n) \to 0$ as $n \to \infty$, then the limit of the left hand side is easily seen to be 1 by a Taylor Series expansion about $\epsilon^{(1)}(n)=0$ to establish the result. Suppose this is not the case. Then, notice that for any $1 \leq k' < k$, $$\prod_{j=1}^{k}(1-\epsilon^{(j)}(n)) = \prod_{j=1}^{k'}(1-\epsilon^{(j)}(n)) \cdot \prod_{j=k'+1}^{k}(1-\epsilon^{(j)}(n)) \overset{(a)}{\geq}$$

$$\prod_{j=1}^{k'}(1-\epsilon^{(j)}(n)) \cdot \prod_{j=k'+1}^{k}\left(1-\epsilon^{(k'+1)}(n)\right) \overset{(b)}{\geq}$$

$$\prod_{j=1}^{k'}(1-\epsilon^{(j)}(n)) \cdot \left(1-\epsilon^{(k'+1)}(n)\right)^k,$$

where (a) follows because $c > 1$, and (b) is the result of multiplying by additional terms that are positive and less than one. Now, choosing k' so that $c^{k'+1} > k^2$, say $k' = \max\{\lfloor 2\log_e k\rfloor, 0\} + 1$, is sufficient to ensure that $k\epsilon^{(k'+1)}(n) \to 0$, and thus $\lim_{n \to \infty}(1-\epsilon^{(k'+1)}(n))^k = 1$ by a Taylor Series argument. In this case:

$$\lim_{n \to \infty} \prod_{j=1}^{k}(1-\epsilon^{(j)}(n)) \geq \lim_{n \to \infty} \prod_{j=1}^{k'}(1-\epsilon^{(j)}(n)).$$

Now, either $k'(n)/g(n) \to 0$ as $n \to \infty$ and the limit of the lower bound is 1 (by a Taylor Series argument), or repeat the process above by introducing some $k'' < k'$ such that $c^{k''+1} > (k')^2$, say $k^{11} = \max\{\lfloor 2\log_e k\rfloor, 0\} + 1 \sim \log_e \log_e k$. Since $g(n)$ exceeds a finite iteration of the log function and $k(n) \leq n$, this reduction process will eventually terminate in a finite number, and the limit in this terminating case will be 1 by a Taylor Series argument, establishing the claim.

Next, let $s = n^{1-\beta}$ for some $\beta \in (0, 1)$, let $\alpha = \sqrt{2r\log n}$ for some $r > 0$, and let $k \in \mathbb{N}$ be a fixed integer. Choose $\epsilon_0 = n^{-1/3}$ and $\Delta < 1 - 2\epsilon_0$, and let $n > \exp(8/\Delta r)$, and:

$$\lim_{n \to \infty} \prod_{j=1}^{k-1}(1-\varepsilon^{(j)}) = 1,$$

which can be seen by making the substitutions $$g(n) = \sqrt{\frac{\pi r \Delta(1+2\varepsilon_0)\log n}{2-\Delta}}, \quad c = \sqrt{\frac{2-\Delta}{1+2\varepsilon_0}}.$$

Thus, a probability tending to one is obtained as $n \to \infty$, $s_{\mathit{eff}} \to s$, $n_{\mathit{eff}} \to s + z \cdot 2^{-(k-1)}$, and $\alpha_{\mathit{eff}} \geq \sqrt{2r(2-\Delta)^{k-1}\log n} > \sqrt{2r(2-\Delta)^{k-1}\log n_{\mathit{eff}}}$. Leveraging the results in the non-adaptive setting, there exists a thresholding procedure of $X_{DS}^{(k)}$ of the form (2) that will drive the FDP and NDP to zero with probability tending to one as $n \to \infty$ whenever $r(2-\Delta)^{k-1} > \beta$, as claimed.

Finally, let $s = n^{1-\beta}$ for some $\beta \in (0, 1)$, and let $\alpha = \alpha(n)$ be any positive monotone diverging sequence in n exceeding the m-fold iteration $\log^{[m]} n$ for an arbitrary finite integer m. Let the number of observations be $$k = k(n) = 1 + \left\lceil \frac{\log\log n}{\log(2-\Delta)} \right\rceil.$$

Choose $\in_0 = n^{-1/3}$ and $\Delta < 1 - 2 \in_0$. Applying the results above, with probability tending to one as $n \to \infty$, $s_{\mathit{eff}} \to s$, $$n_{\mathit{eff}} \to s + \frac{z}{(\log n)^{\log(2)/\log(2-\Delta)}}$$

and $\alpha_{\mathit{eff}} \geq \alpha \sqrt{\log n} > \alpha \sqrt{\log n_{\mathit{eff}}}$. Since $\alpha = \alpha(n)$ diverges, for large enough n the effective observed amplitude will exceed $\sqrt{2\beta \log n_{\mathit{eff}}}$ for any fixed $\beta$. Now, applying the non-adaptive results, there exists a thresholding procedure of $X_{DS}^{(k)}$ of the form (2) that will drive the FDP and NDP to zero with probability tending to one as $n \to \infty$.

Computer System

The methods for data acquisition described above can be implemented as computer software using computer-readable instructions and physically stored in computer-readable medium. The computer software can be encoded using any suitable computer languages. The software instructions can be executed on various types of computers. For example, FIG. 6 illustrates a computer system 600 suitable for implementing embodiments of the present disclosure.

Figure 6:
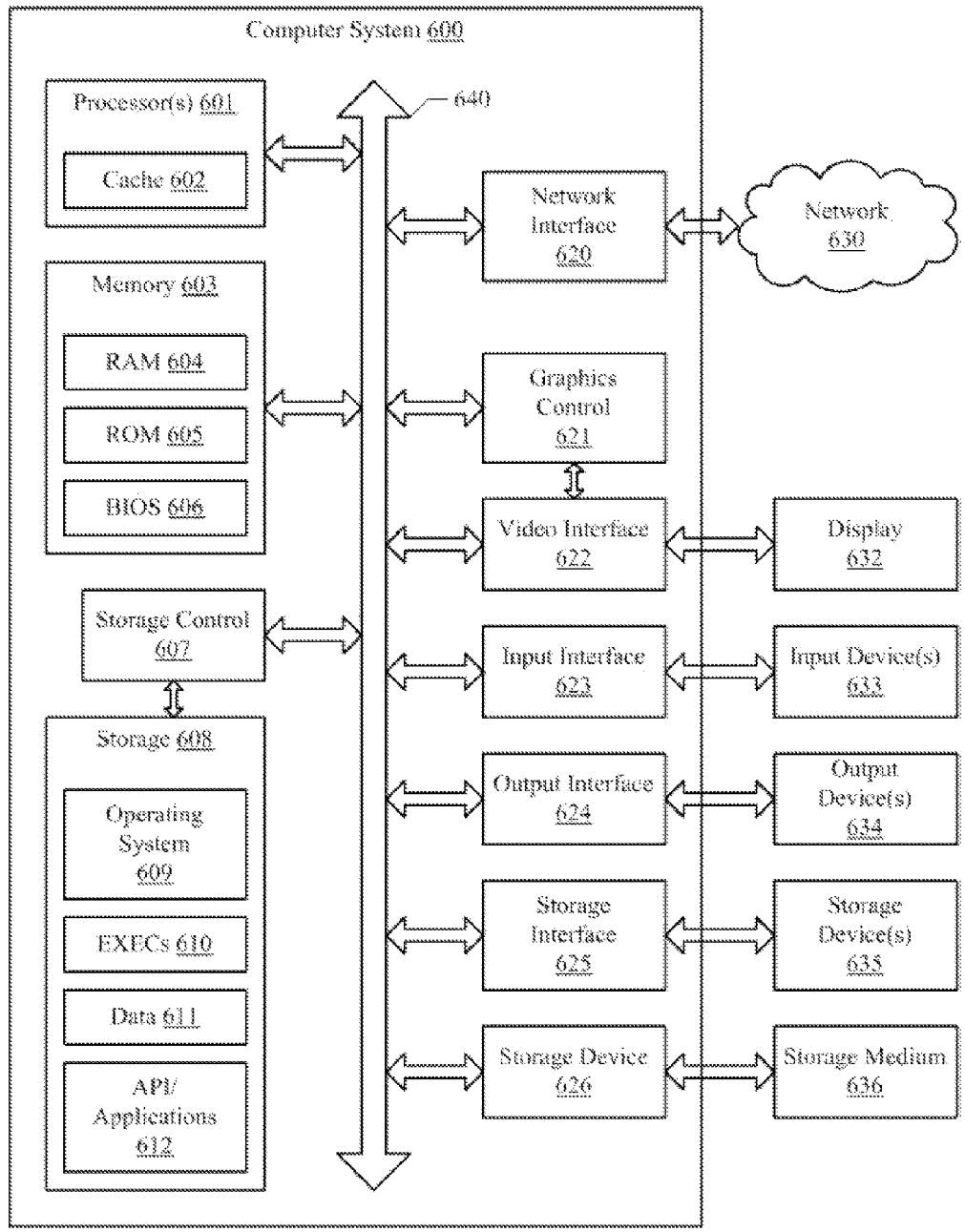
FIG. 6 shows a computer system according to one aspect of the disclosed subject matter.

The components shown in FIG. 6 for computer system 600 are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system. Computer system 600 can have many physical forms including an integrated circuit, a printed circuit board, a small handheld device (such as a mobile telephone or PDA), a personal computer or a super computer.

Computer system 600 includes a display 632, one or more input devices 633 (e.g., keypad, keyboard, mouse, stylus, etc.), one or more output devices 634 (e.g., speaker), one or more storage devices 635, various types of storage media 636.

The system bus 640 link a wide variety of subsystems. As understood by those skilled in the art, a "bus" refers to a plurality of digital signal lines serving a common function. The system bus 640 can be any of several types of bus structures including a memory bus, a peripheral bus, and a local bus using any of a variety of bus architectures. By way of example and not limitation, such architectures include the Industry Standard Architecture (ISA) bus, Enhanced ISA (EISA) bus, the Micro Channel Architecture (MCA) bus, the Video Electronics Standards Association local (VLB) bus, the Peripheral Component Interconnect (PCI) bus, the PCI-Express bus (PCI-X), and the Accelerated Graphics Port (AGP) bus.

Processor(s) 601 (also referred to as central processing units, or CPUs) optionally contain a cache memory unit 602 for temporary local storage of instructions, data, or computer addresses. Processor(s) 601 are coupled to storage devices including memory 603. Memory 603 includes random access memory (RAM) 604 and read-only memory (ROM) 605. As is well known in the art, ROM 605 acts to transfer data and instructions uni-directionally to the processor(s) 601, and RAM 604 is used typically to transfer data and instructions in a bi-directional manner. Both of these types of memories can include any suitable of the computer-readable media described below.

A fixed storage 608 is also coupled bi-directionally to the processor(s) 601, optionally via a storage control unit 607. It provides additional data storage capacity and can also include any of the computer-readable media described below. Storage 608 can be used to store operating system 609, EXECs 610, application programs 612, data 611 and the like and is typically a secondary storage medium (such as a hard disk) that is slower than primary storage. It should be appreciated that the information retained within storage 608, can, in appropriate cases, be incorporated in standard fashion as virtual memory in memory 603.

Processor(s) 601 is also coupled to a variety of interfaces such as graphics control 621, video interface 622, input interface 623, output interface 624, storage interface 625, and these interfaces in turn are coupled to the appropriate devices. In general, an input/output device can be any of: video displays, track balls, mice, keyboards, microphones, touch-sensitive displays, transducer card readers, magnetic or paper tape readers, tablets, styluses, voice or handwriting recognizers, biometrics readers, or other computers. Processor(s) 601 can be coupled to another computer or communications network 630 using network interface 620. With such a network interface 620, it is contemplated that the CPU 601 might receive information from the network 630, or might output information to the network in the course of performing the above-described method. Furthermore, method embodiments of the present disclosure can execute solely upon CPU 601 or can execute over a network 630 such as the Internet in conjunction with a remote CPU 601 that shares a portion of the processing.

According to various embodiments, when in a network environment, i.e., when computer system 600 is connected to network 630, computer system 600 can communicate with other devices that are also connected to network 630. Communications can be sent to and from computer system 600 via network interface 620. For example, incoming communications, such as a request or a response from another device, in the form of one or more packets, can be received from network 630 at network interface 620 and stored in selected sections in memory 603 for processing. Outgoing communications, such as a request or a response to another device, again in the form of one or more packets, can also be stored in selected sections in memory 603 and sent out to network 630 at network interface 620. Processor(s) 601 can access these communication packets stored in memory 603 for processing.

In addition, embodiments of the present disclosure further relate to computer storage products with a computer-readable medium that have computer code thereon for performing various computer-implemented operations. The media and computer code can be those specially designed and constructed for the purposes of the present disclosure, or they can be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher-level code that are executed by a computer using an interpreter.

As an example and not by way of limitation, the computer system having architecture 600 can provide functionality as a result of processor(s) 601 executing software embodied in one or more tangible, computer-readable media, such as memory 603. The software implementing various embodiments of the present disclosure can be stored in memory 603 and executed by processor(s) 601. A computer-readable medium can include one or more memory devices, according to particular needs. Memory 603 can read the software from one or more other computer-readable media, such as mass storage device(s) 635 or from one or more other sources via communication interface. The software can cause processor(s) 601 to execute particular processes or particular parts of particular processes described herein, including defining data structures stored in memory 603 and modifying such data structures according to the processes defined by the software. In addition or as an alternative, the computer system can provide functionality as a result of logic hardwired or otherwise embodied in a circuit, which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several exemplary embodiments, there are alterations, permutations, and various substitute equivalents, which fall within the scope of the disclosed subject matter. It should also be noted that there are many alternative ways of implementing the methods and apparatuses of the disclosed subject matter.

For example, the proposed DS procedure can also be applied to more general classes of signals, such as those for which $\mu$ has both positive and negative values. In this case, one approach would be to split the budget of sensing energy in half, and execute the DS procedure once assuming the signal components are positive as described above, and again assuming the signal components are negative (retaining locations at each part for which the corresponding observation is negative). The final (composite) set of observations can then be subjected to standard FDR controlling procedures. The results presented here also indicate that DS followed by a recovery procedure of the form (2), but where selection of the threshold does not require prior knowledge of the signal amplitude or sparsity parameters, will recover signals that are potentially much more sparse than those described above. Specifically, signals exhibiting general sublinear sparsity having $s(n)$ signal components each with amplitude at least $\alpha(n)$, where $s(n)$ and $\alpha(n)$ are each positive monotone diverging sequences in n and $\alpha(n)$ exceeds some finite iteration of the logarithm function, such that $\alpha(n) \cdot s(n) > c \log \log \log n$ for some c depending on the energy allocation parameter $\Delta$, are recoverable using the adaptive DS procedure.

The foregoing merely illustrates the principles of the disclosed subject matter. Various modifications and alterations to the described embodiments will be apparent to those skilled in the art in view of the teachings herein. It will be appreciated that those skilled in the art will be able to devise numerous modifications which, although not explicitly described herein, embody its principles and are thus within its spirit and scope.

What is claimed is:

1. A method for adaptive data acquisition, comprising:
   (a) performing, by a sensor in communication with a data processor, a first sensing method on a signal having a plurality of components and determining, by the data processor, a first probability that a component is not a relevant signal component;
   (b) comparing, by the data processor, the determined first probability for each of the plurality of components with a first threshold to determine a first subset of components that meet the first threshold;
   (c) performing, by the sensor, a second sensing method on the first subset of components and determining, by the data processor, a second probability that a component is not a relevant signal component, wherein the second probability is more reliable than the first probability; and
   (d) comparing, by the data processor, the determined second probability for each of the first subset of components with a second threshold to determine a second subset of components that meet the second threshold.

2. The method of claim 1, further comprising:
   (e) performing, by the sensor, a third sensing method on the second subset of components and determining, by the data processor, a third probability that a component is not a relevant signal component, wherein the third probability is more reliable than the second probability; and
   (f) comparing, by the data processor, the determined third probability for each of the second subset of components with a third threshold to determine a third subset of components that meet the third threshold.

3. The method of claim 1, wherein the second sensing method is selected from the group consisting of (i) an average of repeated samples of the first sensing method and (ii) an increased observation time of the first sensing method.

4. The method of claim 2, wherein the third sensing method is selected from the group consisting of (i) an average of repeated samples of the first or second sensing method and (ii) an increased observation time of the first or second sensing method.

5. The method of claim 1, wherein the first subset of components that meet the first threshold comprises about 25 percent to about 75 percent of the plurality of components of the signal.

6. The method of claim 1, wherein the second subset of components that meet the second threshold comprises about 25 percent to about 75 percent of the first subset of components.

7. The method of claim 2, wherein the third subset of components that meet the third threshold comprises about 25 percent to about 75 percent of the second subset of components.

8. The method of claim 1, wherein the third subset of components comprises a majority of the relevant signal components.

9. A method for adaptive data acquisition, comprising:
   (a) performing, by a sensor in communication with a data processor, a first sensing method on a signal having a plurality of components and determining, by the data processor, a first probability that a component is not a relevant signal component;

(b) comparing, by the data processor, the first probability for each of the plurality of components with a first threshold to determine a subset of components that meet the first threshold;

(c) performing, by the sensor, a further sensing method on the determined subset of components and determining, by the data processor, a further probability that a component is not a relevant signal component, wherein the further probability is more reliable than a probability determined by a previously-used sensing method;

(d) comparing, by the data processor, the further probability for each of the subset of components with a further threshold to determine a subset of components that meet the further threshold; and (e) if a predetermined number of sensing iterations have been performed or if a predetermined sensing budget is exhausted, identifying, by the data processor, a final subset of components, else repeating (c)-(e).

10. The method of claim 9, wherein at least one further sensing method is selected from the group consisting of (i) an average of repeated samples of a previously-used sensing method and (ii) an increased observation time of a previously-used sensing method.

11. The method of claim 9, wherein the subset of components that meet the first threshold comprises about 25 percent to about 75 percent of the plurality of components of the signal.

12. The method of claim 9, wherein the subset of components that meet the first threshold comprises about half of the plurality of components of the signal.

13. The method of claim 9, wherein the subset of components that meet the further threshold comprises about 25 percent to about 75 percent of the subset of components sensed in (c).

14. The method of claim 9, wherein the subset of components that meet the further threshold comprises about half of the determined subset of components sensed in (c).

15. The method of claim 9, wherein the predetermined number of sensing iterations is less than or equal to a constant multiple of $\log(\log(n))$, where n equals the total number of signal components.

16. The method of claim 9, wherein a largest portion of the predetermined sensing budget is exhausted in (a).

17. The method of claim 9, wherein a largest portion of the predetermined sensing budget is exhausted in a final iteration of (c).

18. The method of claim 9, wherein the final subset of components comprises a subset of components determined in a final iteration of (c).

19. The method of claim 9, wherein the final subset of components comprises a majority of the relevant signal components.

* * * * *